United States Patent [19]
Boerstler et al.

[11] Patent Number: 5,668,507
[45] Date of Patent: Sep. 16, 1997

[54] NOISE GENERATOR FOR EVALUATING MIXED SIGNAL INTEGRATED CIRCUITS

[75] Inventors: David William Boerstler, Round Rock; Daniel Mark Dreps, Georgetown, both of Tex.

[73] Assignee: International Business Machines Corporation, Armonk, N.Y.

[21] Appl. No.: 684,667

[22] Filed: Jul. 22, 1996

[51] Int. Cl.$^6$ .............................. H03B 5/24; H03B 29/00
[52] U.S. Cl. .............................. 331/78; 331/48; 331/57; 331/74; 324/613
[58] Field of Search .............................. 331/34, 46, 48, 331/57, 74, 78, 177 R, 179; 324/613, 614; 327/164; 455/1, 67.3, 67.4

[56] References Cited

U.S. PATENT DOCUMENTS 5,148,124  9/1992  Goff .......................................... 331/78

OTHER PUBLICATIONS

Blalack, Tallis, et al., "The Effects of Switching Noise on an Oversampling A/D Converter," *1995 IEEE International Solid-State Circuits Conference Digest of Technical Papers*, Feb. 16, 1995, pp. 200–201.

Su, David K., et al., "Experimental Results and Modeling Techniques for Substrate Noise in Mixed–Signal Integrated Circuits," *IEEE Journal of Solid-State Circuits*, vol. 28, No. 4, Apr. 1993, pp. 420–430.

Young, Ian A., et al., "A PLL Clock Generator with 5 to 110 MHz of Lock Range for Microprocessors," *IEEE Journal of Solid–State Circuits*, vol. 27, No. 11, Nov. 1992, pp. 1599–1607.

*Primary Examiner*—David Mis
*Attorney, Agent, or Firm*—Robert D. McCutcheon; Winstead Sechrest & Minick P.C.; Anthony V. S. England

[57] ABSTRACT

A method and apparatus for generating noise to be used in evaluation and testing of digital or analog integrated circuits. One or more noise generators fabricated on a substrate generate noise representative of the digital switching noise generated by a digital integrated circuit. The noise generator may be programmable to generate noise over a wide frequency and amplitude range. In addition, a plurality of noise generators may be used to independently and simultaneously generate noise signals with multiple frequencies and amplitudes. A test circuit, either analog or digital, is fabricated on the same substrate. The generated noise signal(s) are generated for use in the evaluation and testing of the effects of the noise on the analog or digital test circuit.

20 Claims, 3 Drawing Sheets

NOISE GENERATOR FOR EVALUATING MIXED SIGNAL INTEGRATED CIRCUITS

TECHNICAL FIELD OF THE INVENTION

The present invention relates to an apparatus and method for generating noise and, in particular, to an apparatus and method for generating noise representative of digital switching noise for use in evaluation and testing of analog and digital circuits.

BACKGROUND OF THE INVENTION

Technological advances in the design and manufacture of integrated circuits are revolutionizing microprocessor design. In the past, microprocessors and the like have consisted almost exclusively of digital circuits. Today, many integrated circuits such as microprocessors, are being designed to include analog and mixed-signal circuits.

During operation, digital integrated circuits produce noise throughout the substrate. This noise, sometimes referred to as "digital switching noise", adversely affects other sensitive digital or analog circuits integrated on the same substrate. Accordingly, analog (or sensitive digital) circuits included within a predominately digital environment are susceptible to digital switching noise produced by operation of the digital circuits. As more and more integrated circuits are being designed to include both digital and analog circuits (i.e. mixed signal integrated circuits), the inclusion of analog circuits increases the probabilities of performance degradation of the analog circuits caused by digital switching noise.

The effects of digital switching noise are becoming increasingly important due to the advanced semiconductor processes and materials used for integrated circuits. Improvements to semiconductor technology have included the construction of a relatively thin lightly doped epitaxial layer on top of a heavily doped layer. This improvement decreased problems associated with latch-up. However, the use of this type of semiconductor technology allows the coupling of noise throughout the substrate. Accordingly, the addition of sensitive analog (or digital) circuits to the integrated circuit increases the susceptibility of these circuits to noise problems.

Accordingly, there exists a need for a noise generator and method for generating noise that is representative of typical digital switching noise present in a completely digital, or predominately digital, integrated circuit. Further, there is needed a noise generator for generating noise for use in the evaluation and testing of analog and digital circuits relating to the effects of noise on such circuits. In addition, a need exists for a method of generating and applying noise for the evaluation of any possible performance degradation of an analog or mixed-signal integrated circuit to help determine the need for effective noise suppression techniques and design modifications of the circuit.

SUMMARY OF THE INVENTION

According to the present invention, there is provided a circuit operable for generating noise for use in evaluating the susceptibility of a first circuit to digital switching noise. Circuitry is fabricated on a substrate and generates noise representative of digital switching noise. The substrate being adoptable for fabricating the first circuit on the substrate.

In accordance with the present invention, there is provided a circuit for generating noise for use in evaluation and testing. The circuit includes a programmable noise generator fabricated on an integrated circuit for generating noise representative of digital switching noise. The programmable noise generator includes a programmable oscillator generating a noise signal having a predetermined frequency within a first range of frequencies and a programmable load buffer circuit coupled to the noise signal for loading the noise signal with a programmable load to generate a transient current. The circuit also includes the circuitry fabricated on the integrated circuit to be evaluated.

In accordance with the present invention, a method is provided for generating and applying noise to a test circuit for the purpose of evaluating and testing the noise susceptibility of the test circuit. The method includes the steps of fabricating the test circuit on an integrated circuit, fabricating a noise generator on the integrated circuit and generating a noise signal within the integrated circuit from the noise generator.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
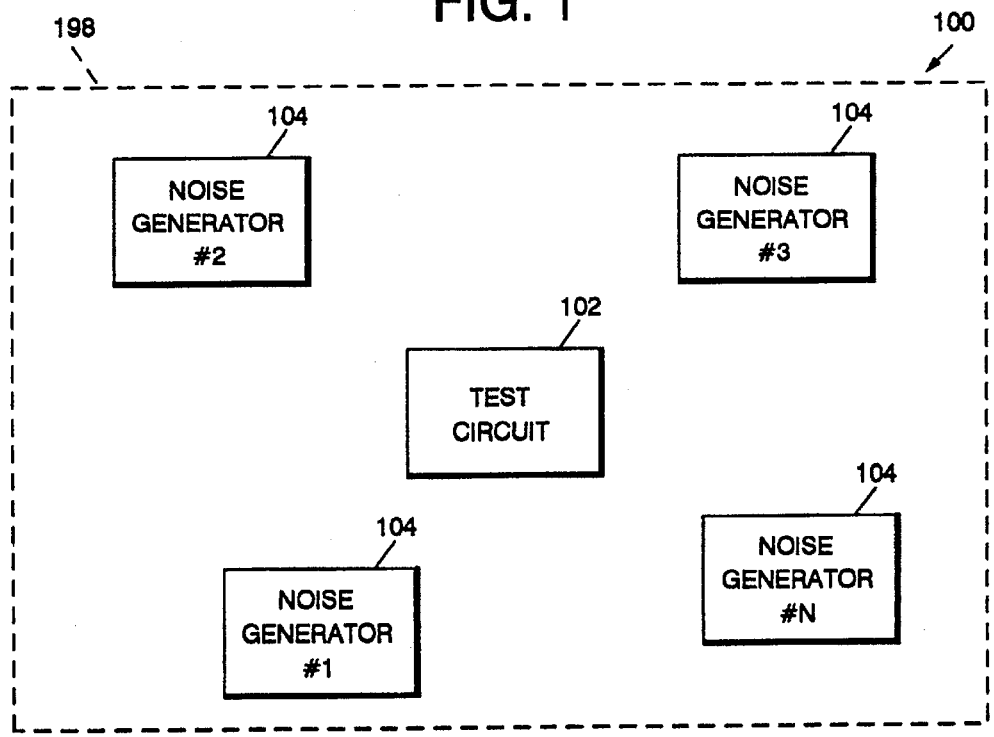
FIG. 1 illustrates a diagram of a circuit in accordance with the present invention.

With reference to the drawings, like reference characters designate like or similar parts throughout the drawings.

Now referring to FIG. 1, there is shown a circuit 100 in accordance with the present invention. The circuit 100 includes a test circuit 102 and a plurality of noise generators 104 fabricated on an integrated circuit or substrate 198. The test circuit 102 is an integrated circuit and can be either analog or digital. The noise generator 104 includes circuitry integrated on the substrate 198 for generating noise (i.e. a noise signal) that propagates through the substrate 198. Accordingly, the test circuit 102 is affected by the generated noise. The generated noise provides a stimulus or input to the test circuit 102 so the effects of the noise on the test circuit 102 may eventually be evaluated. As will be appreciated, the circuit 100 may include only one noise generator 104 or may include a plurality of noise generators 104 (as shown in FIG. 1).

It will be understood that the present invention generates noise representative of the digital switching noise caused by the operation of digital circuits. An analog (or digital) circuit designed to be part of a larger integrated circuit may be tested and evaluated prior to fabrication of the complete integrated circuit. As such, the effects of digital switching noise (i.e. performance degradation) caused by digital components of the integrated circuit may be evaluated prior to actual fabrication of the complete integrated circuit. This allows designers to determine and consider noise suppression techniques and design modifications to reduce the detrimental effects of the digital switching noise on the analog (or sensitive digital) circuit.

Figure 2:
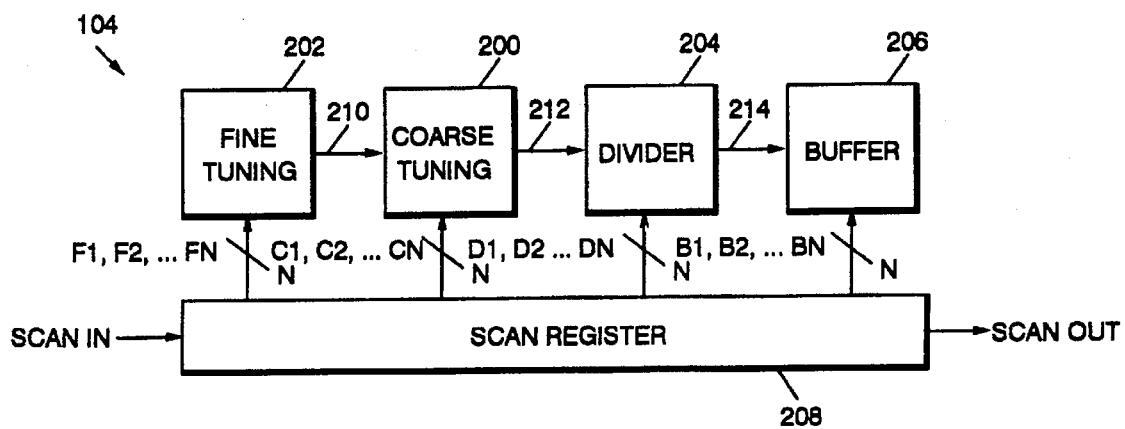
FIG. 2 is a block diagram of a noise generator shown in FIG. 1.

Now referring to FIG. 2, there is illustrated a block diagram of the noise generator 104. The noise generator 104 includes a coarse tuning circuit 200, a fine tuning circuit 202, a divider circuit 204, a buffer circuit 206 and a scan register 208. The coarse tuning circuit 200 functions to generate a noise signal 212 having a predetermined frequency. The fine tuning circuit 202 generates a fine tuning signal 210 that is input to the coarse tuning circuit 200. The fine tuning signal 210 functions to finely vary or adjust the frequency of the noise signal 212 output from the coarse tuning circuit 200. The noise signal 212 is input to the divider circuit 204 which functions to divide or reduce the frequency and/or amplitude of the noise signal 212. The divided noise signal 214 is coupled to the buffer circuit 206 which provides a load on the noise signal 214.

The scan bit register 208 provides digital inputs to each of the circuits 200, 202, 204, 206 thereby providing programmability to each of the circuits 200, 202, 204, 206. The scan register provides control settings (i.e. programming inputs) F1 through FN to the fine tuning circuit 202, control settings C1 through CN to the coarse tuning circuit 200, control settings D1 through DN to the divider circuit 204, and control settings B1 through BN to the buffer circuit 206, where N equals any number of desired programmable input digital lines for each circuit 200, 202, 204, 206. The number N may be a different number for each of the circuits 200, 202, 204, 206 depending upon the desired programmability of the circuits 200, 202, 204, 206. The control settings (i.e. digital bits) are input and stored in the scan register 208. It will be understood that none, any or all of the circuits 200, 202, 204, 206 may be designed to be programmable depending on the desired operation and capabilities of the noise generator 104. In order to reduce I/O pins of the integrated circuit 198, the control bits within the scan register 208 are typically input (i.e. "scanned" in) serially, but may be input in a parallel fashion if so desired. As such, an I/O port to the integrated circuit 198 will be utilized. A microprocessor, CPU, microcontroller, or other circuitry may be coupled to the I/O port (or pin(s)) and utilized to provide the control bits that are input to the scan register 208.

Figure 3:
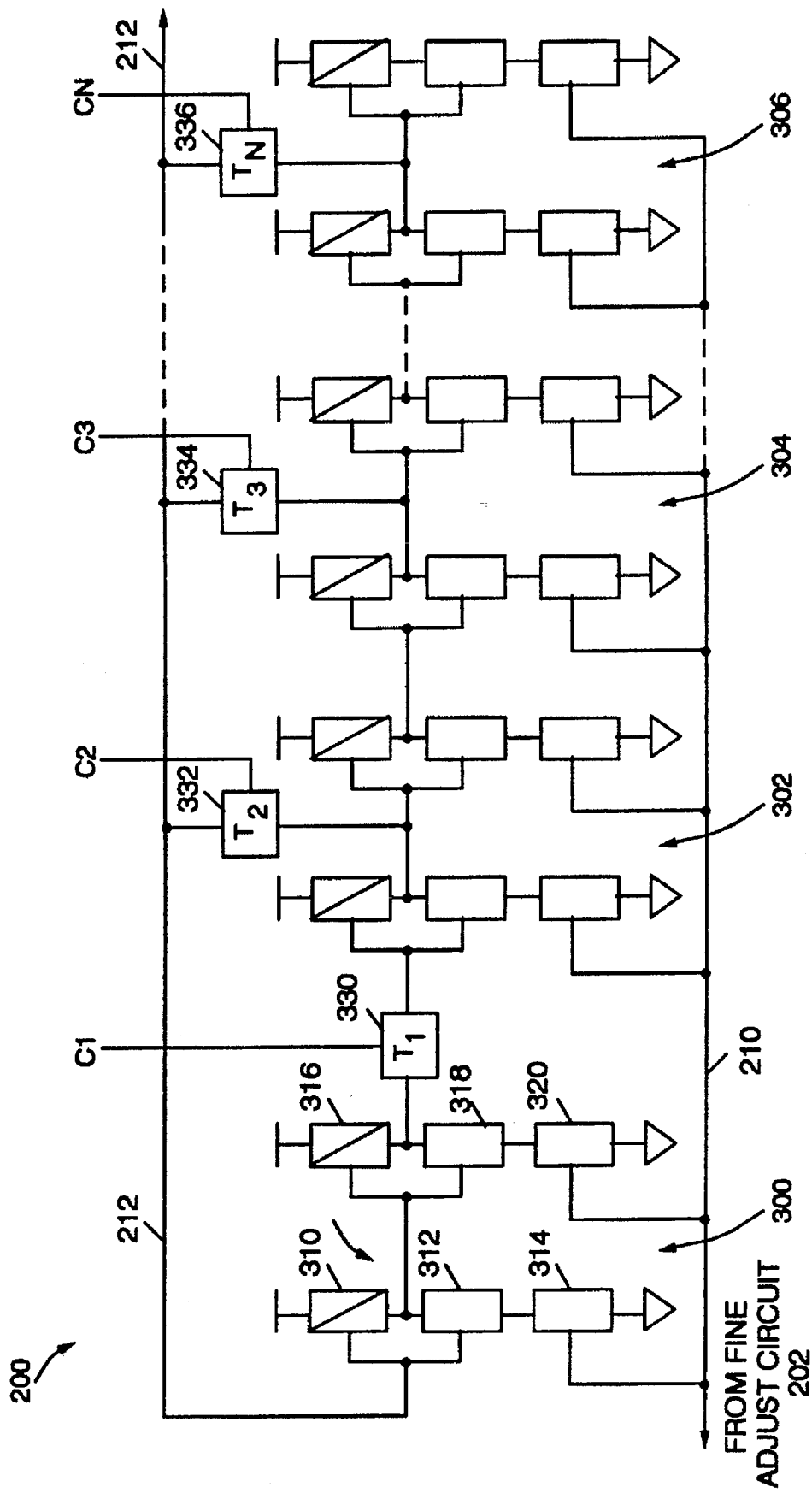
FIG. 3 is a detailed circuit diagram and block diagram of a coarse frequency oscillator circuit shown in FIG. 2.

Now referring to FIG. 3, there is shown a block and circuit diagram of the coarse tuning circuit 200 in the form of a ring oscillator. The coarse tuning circuit 200 is in the form of a ring oscillator that generates the noise signal 212 using a closed loop of an odd number of inverter circuits. The coarse tuning circuit 200 includes a plurality of stages 300, 302, 304, 306. The number of stages depends on the range of frequency desired for the noise signal 212. Each of these stages 300, 302, 304, 306 includes a first CMOS inverter (p-type transistor 310 and n-type transistor 3 12) coupled in series to a second CMOS inverter (p-type transistor 316 and n-type transistor 318).

Transmission gates 332, 334, 336 (T2,T3, . . . TN) are coupled at every odd stage to a common feedback path (i.e. the noise signal 212) which closes the ring. As such, the ring oscillator is a multi-tapped ring oscillator whereby the oscillation signal is tapped off from one of several different points depending on the desired frequency of the oscillation. The transmission gates 332, 334, 336 (T2,T3, . . . TN) are selectably engagable by the control settings C2 through CN, which must be set so that at most one transmission gate is asserted. The frequency of oscillation is approximately equal to the reciprocal of the sum of the rise and fall delays through all elements of the closed loop defined by the selected/asserted transmission gate. Accordingly, relative coarse frequency adjustments are achieved by changing which transmission gate 332, 334, 336 (T2, T3, . . . TN) is engaged, resulting in a large frequency range over which the oscillator may be programmed. Additionally, a transmission gate 330 controlled by control setting C1 and placed in the forward path allows the oscillator to be disabled.

As will be appreciated, the number of stages and the programmability of the ring oscillator depends on the desired frequency range of the noise signal 212. Further, the p-type and n-type transistors of each inverter within each of the plurality of stages of the oscillator may be sized as appropriate to provide appropriate delay times through the inverters. While CMOS inverters have been illustrated, other types of integrated circuit inverters may be used within the ring oscillator.

While the basic oscillator and transmission gates illustrated in FIG. 3 provide a noise signal 212 having a programmable frequency range, the programmability (or tuning) is relatively coarse. To provide a fine tuning of the frequency of the noise signal 212, additional circuitry is utilized. In each of the stages 300, 302, 304, 306, an n-type transistor 314 is coupled in series to the n-type transistor 312, and another n-type transistor 320 is coupled in series to the n-type transistor 318, as illustrated in FIG. 3. The gates of the transistors 314, 320 are coupled to the fine tuning signal 210. Adjustment of the fine tuning signal 210 allows control over the rise and fall times of the respective inverters. The current in each inverter is controlled by the fine tuning signal 210 coupled to the gates of the transistors 314, 320. When the fine tuning signal is at its maximum voltage, the generated noise signal 212 will have its maximum frequency for a given coarse setting. As the voltage of the fine tuning signal 210 is reduced, the frequency for a given coarse setting is also reduced. Accordingly, the fine tuning signal 210 allows fine frequency adjustment of the frequency for a given coarse frequency set by the programmable ring oscillator.

Figure 4:
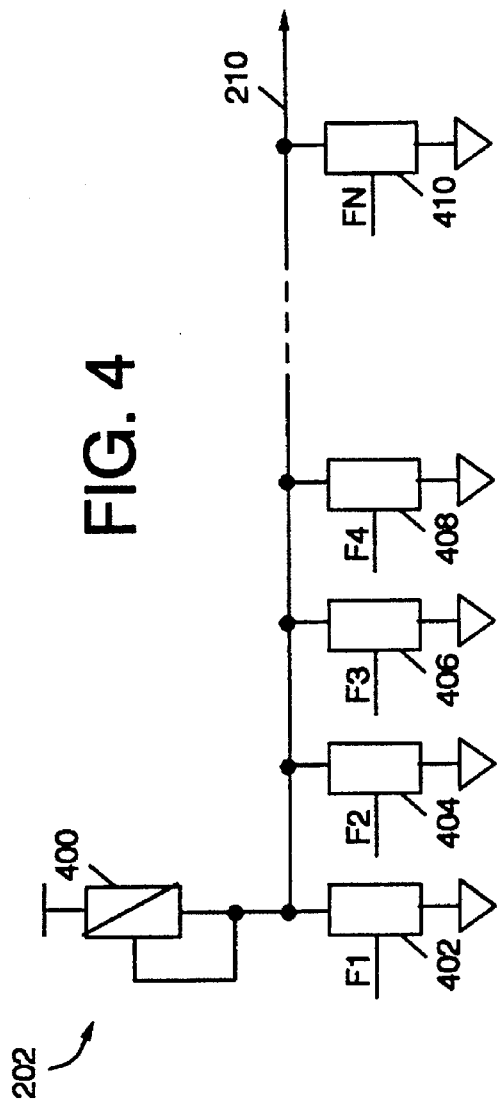
FIG. 4 is a derailed circuit diagram of a fine tuning circuit shown in FIG. 2.

Now referring to FIG. 4, there is shown a circuit diagram of the programmable fine tuning circuit 202 that generates the fine tuning signal 210. The circuit 202 includes a p-type transistor 400 coupled to a plurality of parallel n-type transistors 402, 404, 406, 408, 410, as illustrated in FIG. 4. Each gate of the respective transistors 402, 404, 406, 408 is coupled to a respective control setting F1, F2, . . . FN (i.e. programming bits from scan register 208). The fine tuning signal 210 is pulled to its maximum value when all the control settings are low (i.e. logic zero). As the control inputs F1,F2, . . . FN are asserted (i.e. logic high), the voltage value of the fine tuning signal 210 is reduced. The fine tuning circuit 202 functions to fine tune the frequency of the noise signal 212 generated by the oscillator within the coarse frequency circuit 200. It will be understood that a person skilled in the art may design fine tuning circuit 202 with N number of n-type transistors (and any desired sizing) to provide the desired programmability and adjustment of the fine tuning signal 210.

Now referring back to FIG. 2, the noise signal 212 is coupled to the divider circuit 204. The divider circuit 204 is a conventional programmable divider that extends the frequency range of the noise signal 212 to low frequencies by dividing its frequency. Control settings (or inputs) D1, D2, . . . DN program the functioning of the divider circuit to provide various levels of division of the frequency of the noise signal 212. A detailed circuit diagram of the divider circuit 204 has not been provided. It will be understood that numerous structures may be designed by those skilled in the art to perform the desired function of the divider circuit 204.

Figure 5:
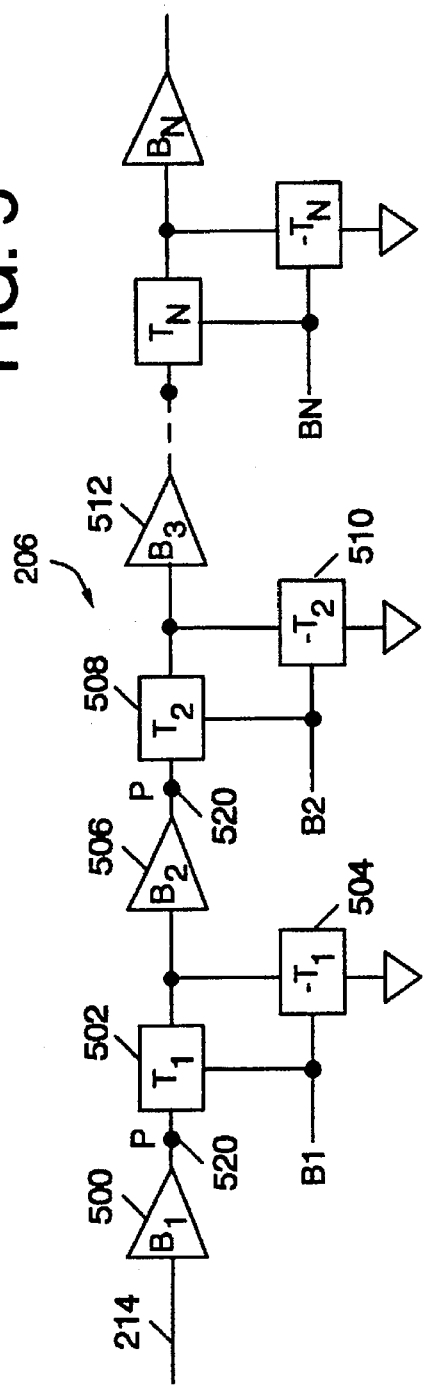
FIG. 5 is a derailed block diagram of a buffer circuit shown in FIG. 2.

Now referring to FIG. 5, there is shown a block diagram of the buffer circuit 206. The noise signal 214 output from the divider circuit 204 is coupled to the buffer circuit 206. The buffer circuit 206 includes a plurality of load buffers 500, 506, 512 (B1, B2, . . . BN) where N is the number of desired load buffers. The buffer circuit 206 produces varying loads for the noise signal 214, thus producing varying degrees of switching current. Control settings (inputs) B1, B2, . . . BN from scan register 208 allow the loading effect of the buffer circuit 206 to be programmable. As the load buffers 500, 512 (B2, B3, . . . BN) are successively engaged beginning with load buffer 506 via a transmission gate 502 (T1), the transient current increases due to the coupling of the load buffer 506. If increased loading is desired, a transmission gate 508 (T2) is asserted thereby coupling the load buffer 512, and so on. To prevent false switching for any load buffers desired not to be coupled, the load buffers include a shunted transmission gate 504, 510 (−T1,−T2) to ground. The shunted transmission gates 504, 510 (−T1,−T2) operate in a complementary fashion to the corresponding transmission gate 502, 508 (T1, T2). Probing points 520 (P) are included to allow frequency and transition time measurements (i.e. for calculating transient currents) using mechanical or e-beam probing.

It will be understood that those skilled in the art will be able to design circuitry capable of performing the functions of the programmable buffer circuit 206 as outlined above. Further, in one embodiment, the programmable buffer circuit 206 is a tapered buffer where the width/length (of transistors) within the load buffer 500 (B1) is less than the width/length (of transistors) within the load buffer 506 (B2) which is less than the width/length (of transistors) within the load buffer 512 (B3), and so on.

Now referring back to FIG. 1, the circuit 100 includes a plurality of noise generators 104 placed on the integrated circuit or substrate 198 wherever desired to generate noise (noise signals). Generally, the noise generators 104 are independently programmable via the scan register 208 (shown in FIG. 2). The individual noise generators may be programmed to operate to produce noise signals with different frequencies and amplitudes over a wide range, which in the aggregate, may be used to simulate a microprocessor's digital switching signature for different applications. Accordingly, the noise generators 104 are capable of generating noise with a specific spectral signature (i.e. simulative) of a digital system which can be used to test the susceptibility of various circuits (analog or digital) to the digital switching noise generated by the digital system. Further, use of a plurality of noise generators 104 allows the generation of noise having multiple frequencies independently and simultaneously.

As an example, the present invention may be fabricated in deep sub-micron technology for use in evaluating noise concerns in a high-frequency phase-locked loop (PLL) for microprocessors. Six noise generators may be fabricated at various points on the substrate. Each of the noise generators includes twelve (12) coarse settings and seven (7) fine tuning settings capable of operation over a frequency range of 125 to 1100 MHz. Further, a six-stage programmable buffer circuit capable of introducing a load providing 0 to twenty-four (24) mA peak current may be designed and utilized for each noise generator.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A circuit operable for generating noise to evaluate the susceptibility of circuitry to digital switching noise, comprising:

a substrate adaptable for fabricating a first circuit to be evaluated for susceptibility to digital switching noise; and circuitry for generating noise representative of digital switching noise, the generating circuitry fabricated on the substrate.

2. The circuit in accordance with claim 1 wherein the circuitry for generating the noise is programmable to adjust the frequency of the noise.

3. The circuit in accordance with claim 1 wherein the first circuit comprises an analog circuit.

4. The circuit in accordance with claim 1 wherein the circuitry for generating the noise is programmable to adjust the amplitude of the noise.

5. The circuit in accordance with claim 1 wherein the circuitry for generating the noise includes a noise generator comprising:

a programmable frequency oscillator for generating a noise signal;

a programmable load buffer circuit for loading the noise signal with a programmable load to generate a transient current.

6. The circuit in accordance with claim 5 wherein the programmable frequency oscillator is a ring oscillator.

7. The circuit in accordance with claim 1 wherein the circuitry for generating the noise includes a plurality of noise generators, each noise generator located at a predetermined position on the substrate and each noise generator comprises:

a programmable frequency oscillator for generating a noise signal;

a programmable load buffer circuit coupled to the noise signal for loading the noise signal with a programmable load to generate a transient current.

8. An apparatus operable for generating noise to evaluate the susceptibility of a circuit to digital switching noise, wherein the circuit is fabricated on an integrated circuit, comprising:

a programmable noise generator for generating noise representative of digital switching noise, the noise generator fabricated on the integrated circuit and comprising, a programmable oscillator generating a noise signal having a predetermined frequency within a first range of frequencies, and a programmable load buffer circuit coupled to the noise signal for loading the noise signal with a programmable load to generate a transient current.

9. The apparatus in accordance with claim 8 wherein the circuit comprises analog circuitry.

10. The apparatus in accordance with claim 8 wherein the programmable oscillator comprises:

a programmable ring oscillator circuit having a plurality of stages and a plurality of selectable taps and generating the noise signal having a coarse frequency within the first range of frequencies, the coarse frequency dependent on the selected one of the plurality of selectable taps; and a fine-tune circuit coupled to each of the plurality of stages of the programmable ring oscillator circuit for fine-tuning the coarse frequency to generate the predetermined frequency.

11. The apparatus in accordance with claim 10 wherein the programmable load buffer circuit includes a plurality of selectably engageable buffers for supplying the programmable load coupled to the noise signal.

12. The apparatus in accordance with claim 11 wherein the circuit includes a plurality of programmable noise generators for generating a plurality of independent noise signals.

13. The apparatus in accordance with claim 11 further comprising a programmable divider circuit coupled between the programmable oscillator and the programmable load buffer circuit for dividing the frequency of the noise signal prior to input to the programmable load buffer; and a register, coupled to the programmable oscillator, the programmable divider circuit, and the programmable load buffer circuit, for storing a plurality of control bits, the control bits programming the programmable oscillator, the programmable divider circuit, and the programmable load buffer circuit.

14. A method for generating and applying noise to a test circuit for the purpose of evaluating and testing the noise susceptibility of the test circuit, comprising the steps of:

fabricating the test circuit on an integrated circuit;

fabricating a noise generator on the integrated circuit; and generating a noise signal within the integrated circuit from the noise generator.

15. The method in accordance with claim 14 further comprising the step of programming the noise generator to generate the noise signal having a predetermined frequency.

16. The method in accordance with claim 15 further comprising the step of programming the noise generator to generate the noise signal having a predetermined amplitude.

17. The method in accordance with claim 14 further comprising the steps of:

fabricating a second noise generator on the integrated circuit; and generating a second noise signal within the integrated circuit from the second noise generator.

18. The method in accordance with claim 17 wherein the noise generated by the noise generators comprises a noise spectrum representative of digital switching noise.

19. The method in accordance with claim 14 wherein the step of generating a noise signal includes the steps of generating the noise signal having multiple frequencies independently and simultaneously.

20. The method in accordance with claim 19 wherein the test circuit comprises analog circuitry.

* * * * *